United States Patent [19]

Bretscher et al.

[11] Patent Number: 4,500,790
[45] Date of Patent: Feb. 19, 1985

[54] SYSTEM FOR IMPROVING THE UNIFORMNESS OF PATTERNS GENERATED BY ELECTRON BEAM LITHOGRAPHY

[75] Inventors: Erwin Bretscher, Rapperswil; Peter Vettiger, Langnau am Albis, both of Switzerland

[73] Assignee: International Business Machines Corporation, Armonk, N.Y.

[21] Appl. No.: 435,174

[22] Filed: Oct. 19, 1982

[30] Foreign Application Priority Data

Nov. 30, 1981 [EP] European Pat. Off. ........ 81110007.2

[51] Int. Cl.³ ............................................. G01N 23/00
[52] U.S. Cl. .................................. 250/492.2; 250/397
[58] Field of Search ...................... 250/492.2, 397, 398; 219/121 EB, 121 EM

[56] References Cited

U.S. PATENT DOCUMENTS

| | | | |
|---|---|---|---|
| 3,711,711 | 1/1973 | Dao et al. | 250/310 |
| 3,778,626 | 12/1973 | Robertson | 250/492.2 |
| 3,854,071 | 12/1974 | Heritage et al. | 315/30 |
| 3,922,546 | 11/1975 | Livesay | 250/398 |
| 4,021,675 | 5/1977 | Shifrin | 250/492.2 |
| 4,056,730 | 11/1977 | Davis | 250/492.1 |

OTHER PUBLICATIONS

"Electron Beam Lith. for Complex High Density Devices", Chang et al., Electron and Ion Beam Science and Tech., Sixth Int. Conf., 1974, pp. 581-583.
"Registration Mark Detection for Electron-Beam Lithography-Ell-Syst.", Davis, IBM J. Res. Develope, vol. 24, No. 5, Sep. 1980, pp. 545-553.
"Practical Scanning Electron Microscopy", Goldstein et al., Plenum Press, New York 1975, pp. 96-97.

Primary Examiner—Bruce C. Anderson
Attorney, Agent, or Firm—Sughrue, Mion, Zinn, Macpeak, and Seas

[57] ABSTRACT

A system to improve the uniformness of patterns for LSI circuits or masks generated in an electron beam lithographic system uses a backscatter indicator signal to vary a control signal for the beam stepping rate proportional to the variations in the amount of backscattered electrons. This avoids non-uniformity such as line width variations which otherwise occur when the pattern to be generated covers border lines between two different substrate or base layer materials. Range setting circuitry is provided for adjusting, during an initial prescan of a sample of two materials having an extreme difference in their backscatter characteristic, the offset and the gain for the backscatter detector. During subsequent exposure of a wafer, the backscatter indicator signal and thus the stepping rate control signal variations remain within preselected limits.

7 Claims, 7 Drawing Figures

SYSTEM FOR IMPROVING THE UNIFORMNESS OF PATTERNS GENERATED BY ELECTRON BEAM LITHOGRAPHY

BACKGROUND OF THE INVENTION

1. Field of the Invention

This invention is related to electron-beam lithography. In particular, it is related to proximity-effect correction for raster-scan or vector scan electron-beam lithographic systems.

2. Prior Art

Electron-beam technology can be used for producing patterns in large scale integrated (LSI) circuit manufacturing, or for producing masks to be used in optical or X-ray lithography. A layer of photoresist material, deposited on a substrate or over a previously formed structure, is exposed by an electron beam to form the desired pattern by subsequent developing, etching and depositing or removing further material to obtain a structure of fine metal, semiconductor or insulator patterns having specific properties.

The electron beam can expose the photoresist either through a mask, or it can be guided over the photoresist in a raster-scan or vector-scan method to generate the desired pattern. Such electron beam lithography systems are described, e.g. in U.S. Pat. Nos. 3,644,700, 3,866,013, 3,875,415, 3,876,883, and 4,056,730.

An undesirable effect in electron-beam lithography is exposure by backscattered electrons. This results in nonuniform developing of exposed resist areas, depending on the shape and interrelation of the generated patterns. Fine lines, for example, tend to be underdeveloped and gaps between exposed areas tend to become smaller than desired. Conversely, in corners or in the center of wide lines, some overdeveloping occurs, which is also designated as blooming. The undesired exposure by backscattered electrons and the resulting non-uniform developing are generally called "proximity effects" because they occur in the proximity of the areas exposed by the electron beam (which causes the backscattered electrons). The amount or intensity of the backscattering depends on the thickness and composition of the photoresist layer and on the substrate material, and its distribution is dependent on shapes or topological detail. Proximity effects may occur intrashape, for example, within a single line if it is wide enough or makes turns, or they may occur intershape, that is, electron beam exposure for one line may have an influence on the exposure extent of a line located in close proximity but covered by the electron beam earlier or later (in another scan pass).

Methods have been suggested and are used by which proximity effects in electron beam lithography can be reduced or eliminated. Such methods were disclosed in following publications:

M. Parikh: "Proximity effects in Electron Lithography: Magnitude and Correction Techniques", IBM J. of Res. and Dev., Vol. 24, No. 4, July 1980, pp. 438–451.

W. D. Grobman et al: "Proximity Correction Enhancements for 1-$\mu$m Dense Circuits", IBM J. of Res. and Dev., Vol. 24, No. 5, September 1980, pp. 537–544.

T. P. Chang et al: "Partitioning E-Beam Data for Proximity Corrections", IBM TDB, Vol. 20, No. 9, February 1978, pp. 3809–3812.

M. Parikh: "Self-Consistent Correction of Proximity Effects in Electron-Beam Lithography", IBM TDB, Vol. 22, No. 9, February 1980, pp. 4327–4328.

E. Bretscher: "Proximity Correction in Electron Beam Lithography", IBM TDB, Vol. 23, No. 6, November 1980, p. 2541.

These methods essentially involve the following considerations. The shapes to be generated are analyzed and subdivided to obtain areas of equal backscatter electron distribution. An algorithm is used to determine, by a computer program in advance of the lithographic procedure, how an even dose distribution of electrons for the given shape can be achieved despite proximity effects. The electron beam is then controlled by the program output data in a different way than it would be controlled without correction. This may involve reduction of shapes to reduce excessive exposure by backscatter electrons, and expansion of shapes which otherwise would not be developed sufficiently in relation to other portions of a pattern. Alternatively, it may involve subdividing the shape into different areas for which different electron beam dwell times or intensities are used.

It is a disadvantage of these known methods that they need preprocessing. That is, an analysis must be made in advance of the electron beam exposure process. Furthermore, these methods are based on approximative models and rely on presumed dimension parameters which actually may be slightly different.

SUMMARY OF THE INVENTION

It is an object of the present invention to provide a system for reducing proximity effects in electron beam lithography which operates in real time and requires no preprocessing.

It is another object to define a system for improving uniformness in patterns generated by electron beam lithography despite variations in the substrate or in previously deposited layers below the surface layer exposed to the electron beam. Such variations may be differences in material or topological changes.

Yet another object is to provide improvements in proximity effect correction which are not dependent on a correction model or algorithm but are directly responsive to actual electron beam exposure and backscatter conditions.

A further object of the invention is to reduce the effects of non-uniformity of base layers on the degree of exposure with a minimum in additional hardware for the electron beam control system.

These objects can be achieved by the invention wherein a system of improving the uniformness of patterns generated by electron beam lithography in a covering layer over a substrate or base layer is defined. In accordance with the invention, an indication signal for the quantity of backscattered electrons is obtained during exposure and is used as a control signal for adjusting the electron beam stepping rate in such a way that the exposure dose per unit length is kept approximately constant despite variations in the material or topography of the substrate or base layer. The invention will be described in greater detail by referring to drawings, photographs and the description of the preferred embodiment that follows.

BRIEF DESCRIPTION OF THE DRAWING

A preferred embodiment of the invention is disclosed in the following in connection with drawings and photographs.

DETAILED DESCRIPTION OF THE PREFERRED EMBODIMENT

Figure 1A:
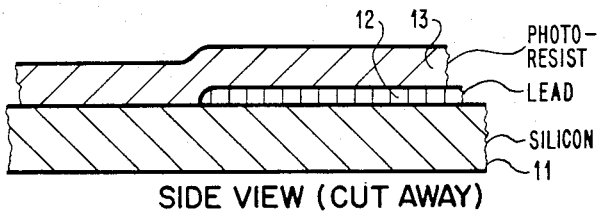
FIG. 1A is a sectional view (profile) of a non-uniform base layer or substrate covered by a photoresist to be exposed by an electron beam.
Figure 1B:
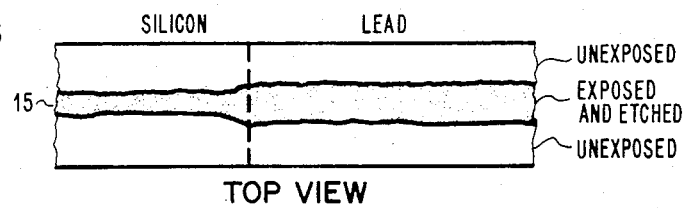
FIG. 1B is a top view of the structure of FIG. 1A after electron beam exposure and development showing non-uniformity of the line width due to a variation in the base layer or substrate.

Referring now to FIGS. 1A and 1B, a portion of an integrated circuit structure comprising different materials is shown in illustrate the proximity effect due to a variation in the substrate or base layer material. In FIG. 1A, a silicon wafer 11 is partially covered by a layer 12 of lead, and both are covered by a photoresist layer 13 which is to be exposed by an electron beam (hereinafter e-beam) to obtain a line which, after developing and etching, forms a channel for depositing or removing further material. Due to different electron backscatter properties of the silicon and the lead, the line 17 shown in the top view of FIG. 1B will receive, despite a constant e-beam intensity and speed, a smaller electron dose above the silicon than above the lead. This results, after development, in a line of varying width as shown which is undesirable because of the small tolerances that can be allowed in densely packed structures of complex large scale integrated circuitry.

Figure 2:
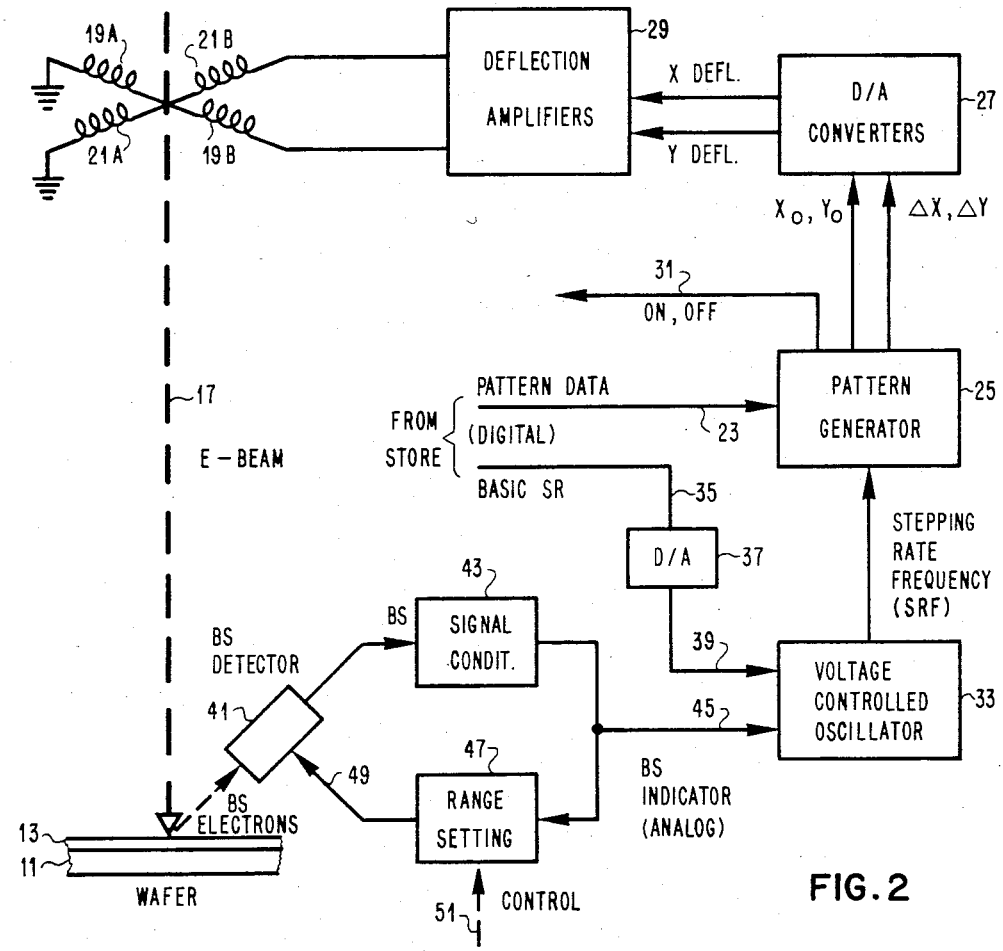
FIG. 2 is a block diagram of an electron beam exposure system comprising an arrangement for practicing the invention.

FIG. 2 is a block diagram of an e-beam raster scan lithographic system which shows only those essential components which are important for a complete understanding of the present invention. A more complete description of e-beam lithographic systems is contained in cited U.S. patents, which, to the extent necessary, are incorporated herein by reference.

A wafer 11 is covered by a photoresist layer 13 which is exposed by e-beam 17. E-beam 17 is guided over the photoresist in a raster scan by the magnetic fields of X deflection coils 19A, 19B and Y deflection coils 21A, 21B, and it is blanked and unblanked by control electrodes, not shown in the drawing, for generating the desired shape. Such techniques are well established in the art.

Pattern data describing the shape are fed from a computer storage via input line 23 to a pattern generator 25. The pattern generator furnishes for each of a number of elementary shapes origin coordinates $X_o$ and $Y_o$, and additionally furnishes, successively and alternatingly, stepping values $\Delta X$ and $\Delta Y$ for moving the e-beam from the selected origin along a specific path. The digital X and Y signals are transferred to digital/analog converters 27 which furnish at their outputs an X deflection signal and a Y deflection signal in analog form. These signals are amplified in deflection amplifiers 29 and are applied from there to e-beam deflection coils 19A, 19B and 21A, 21B.

A control signal for blanking and unblanking the e-beam while it is moved along by the deflection signals, is also provided by pattern generator 25 on an output line 31. This signal is applied to the blanking/unblanking electrodes not shown in the drawing.

The speed or stepping rate at which the electron beam moves is determined by the output frequency of a voltage-controlled oscillator (VCO) 33. This output frequency or stepping rate frequency SRF is applied to an input of pattern generator 25 and determines the rate at which the alternating $\Delta X$ values and $\Delta Y$ values are furnished to D/A converters 27. A basic stepping rate value SR is furnished in digital form (e.g. from computer storage) via line 35 to D/A converter 37, and the analog output voltage representing this basic stepping rate is applied to an input 39 of voltage controlled oscillator 33.

Without the correction corresponding to this invention, the e-beam would move across photoresist layer 15 at the basic stepping rate given by signal SR and the resulting lines or patterns would be non-uniform as explained in connection with FIG. 1A and 1B due to non-uniformness of the substrate 11 the base layers. To compensate for the irregular backscatter characteristics of the substrate and base layers, the reason for non-uniform exposure, a backscatter or BS signal furnished by backscatter electron detector 41 is obtained and used to control variations in the e-beam stepping rate in real time. No extra backscatter detector need be provided because such detectors are usually present in e-beam lithography systems for registration mark detection (as described in the U.S. patents discussed herein). However these detectors are not conventionally used during the exposure process.

The BS signal is furnished to a signal conditioner 43 which elminates the noise picked up by detector 41 in addition to the actual backscattered electrons. The output signal of signal conditioner 43 is an analog BS indicator signal which varies as the e-beam moves across wafer 11 if the latter is partially covered by different materials or has other irregularities. This signal is furnished as correction signal to another input 45 of voltage controlled oscillator 33, and is added to the basic analog SR signal on line 39 so that the controlling voltage to VCO 33 varies as a function of the amount of backscatter picked up by BS detector 41. The stepping rate frequency SRF furnished by VCO 33 therefore varies in response to this backscatter signal. Thus the speed or stepping rate of the scanning electron beam is directly adjusted to the actual amount of backscattering in real time. When the number of backscattered electrons increases, the stepping rate is also increased, and vica versa, to keep the dose of electrons to which photoresist layer 13 is exposed approximately constant.

In this embodiment, a linear relationship is used between the BS indicator signal on input 45 and the resulting stepping rate frequency variations generated by VCO 33. It is, of course, possible to provide additional circuitry at input 45 for introducing another relationship, for example, quadratic or exponential, if this would result in better correction results for a given system or for specific materials.

It is necessary to restrict variations of the stepping rate and thus variations of the output frequency of VCO 33 in an acceptable range between given limits. For this purpose, a range setting procedure is executed prior to an electron beam lithographic process, for setting the zero point (offset) and the gain of backscatter detector 41 to values such that at the lowest and the highest backscatter intensities the generated BS indicator signal is still within the desired limits. In principle, the range setting operation could be done manually. A sample wafer would be placed under the electron beam and scanned while the offset and gain are adjusted manually until the BS indicator signal or the stepping rate frequency remain within the required range. An extra output and visual indicator for one of these two signals would, of course, be required.

In accordance with this embodiment of the invention, an automatic procedure is used. Range setting circuitry 47 is provided for this automatic procedure. Its input is connected to signal conditioner 43 to receive the actual BS indicator signal furnished to VCO 33. The control outputs 49 of range setting circuitry 47 are connected to backscatter detector 41 for applying offset and gain control signals which are generated during the automatic range setting procedure in response to the variations of the BS indicator signal. A control input 51 is provided for applying an initiating pulse from a scanner control unit or processor. Pertinent details of range setting circuitry 47 are shown in FIG. 3.

The principle of the automatic range setting procedure will now be described. A small sample wafer of material having the lowest occurring backscatter rate (e.g. silicon), carrying across it a strip of material having the highest occurring backscatter rate (e.g. a thick layer of lead or gold) is permanently mounted on the wafer holder on which the workpieces, i.e. the wafers are usually placed for inserting them into the e-beam chamber. Thus the range setting sample is located in a known place at the margin of the wafer holder and is disposed on the same height level as the wafers to be exposed.

When the chip to be exposed is mounted onto the holder, the coordinate table with the wafer holder and the electron beam are initially, that is, before the actual wafer exposure begins, moved in such a way that the electron beam scans across the sample chip comprising the two "extreme" materials. The beam control arrangement issues an initial pulse when the beam scan is started. The initial scan includes several repetitive scans of the sample wafer. The scanning motions are slow enough so that the range setting circuitry can electronically achieve the following adjustments. During lowest possible backscatter value, the offset of backscatter detector 41 is adjusted to a value so that the BS indicator signal is at the lower limit of the allowed range. During changes from the lowest to the highest possible backscatter value, the gain of backscatter detector 41 is adjusted so that the resulting BS indicator signal will not exceed the upper limit of the allowed range. After the initial range setting procedure, scanning and exposure of the actual workpiece (chip) is done. The proximity effect correction will then be effected optimally irrespective of different substrate or base layer materials and where they are located.

Figure 3:
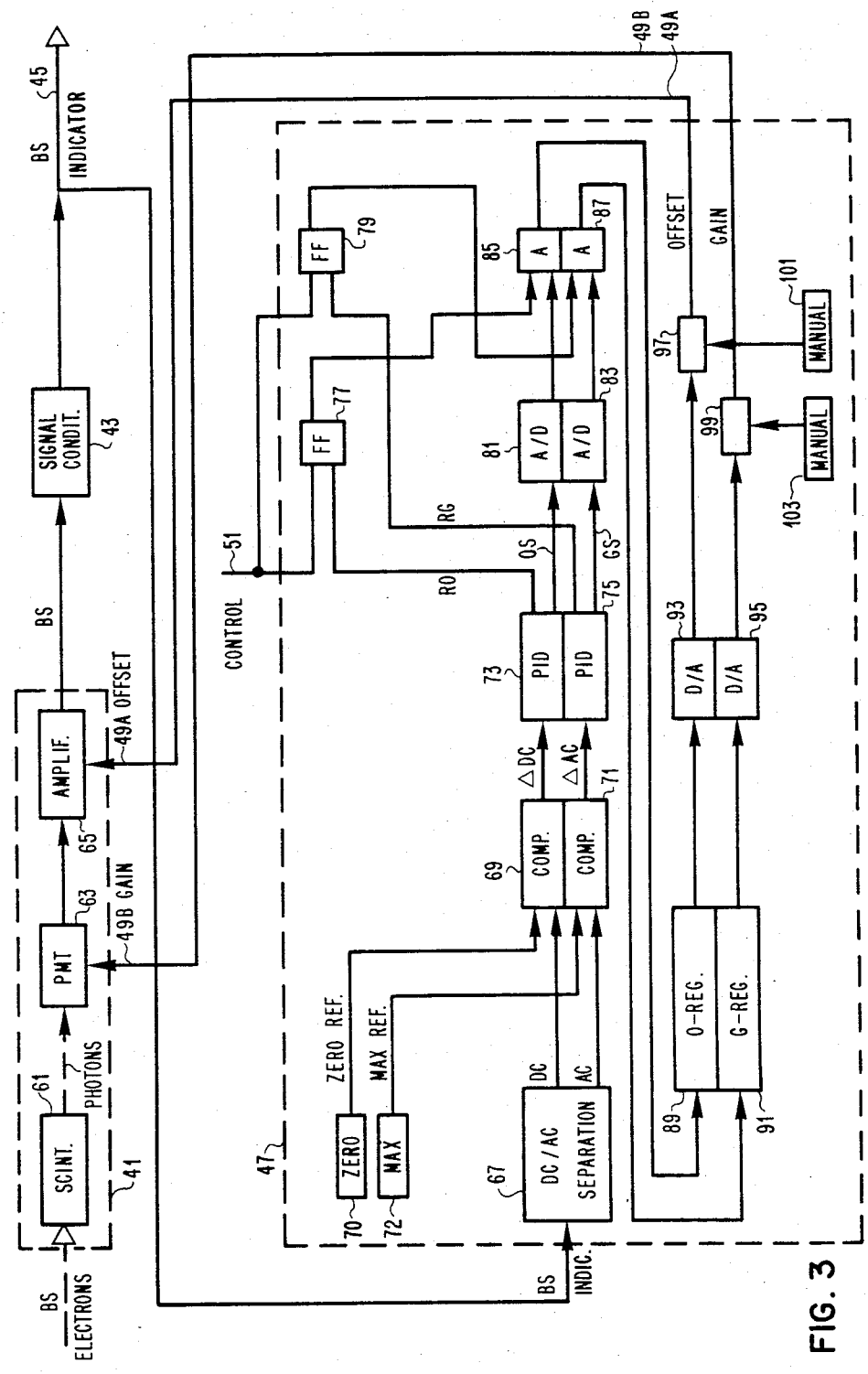
FIG. 3 is a block diagram illustrating the range setting circuitry for the backscatter detector to obtain a variation range for the electron beam stepping rate which is suitable for all substrate materials.

Referring now to FIG. 3, additional details of range setting circuitry 47 and of its operation will be described. FIG. 3 shows at the top a block diagram of backscatter detector 41, boxed in with dashed lines. It comprises a scintillator 61 collecting the backscattered electrons and converting them into photons. The photons are applied to a photomuliplier tube 63 which furnishes at its output an electronic signal representing the amount of backscattered electrons, which in turn is applied to the input of an amplifier 65. The output signal BS of amplifier 65 is applied to signal conditioner 43 which eliminates the noise component and furnishes the BS indicator signal to input 45 of VCO 33. Amplifier 65 has a control input terminal 49A for setting the offset, and photomultiplier tube 63 has a control input 49B for setting the gain.

Details of range setting circuitry 47 are shown in the lower portion of FIG. 3. It comprises a DC/AC separation circuit 67 to which the BS indicator signal from signal conditioner 43 is applied. The circuit furnishes at its output the DC component and AC component, respectively, of its input signal. Two comparators 69 and 71 are provided. Comparator 69 receives the DC component from separator 67 and a zero reference signal from unit 70. Unit 70 may be a potentiometer or a selector switch connected to a voltage source. Comparator 71 receives the AC component from separator 67 and a maximum reference signal from unit 73 (which is similar to unit 70). The output signal of comparator 69 is a $\Delta$DC value (or error signal) indicating the difference between the DC signal component and the zero reference signal, which difference should reach zero. Similarly, the output signal of comparator 71 is a $\Delta$AC signal which should reach zero. Both $\Delta$ signals (or error signals) are converted by respective proportional integral control units 73 and 75 (PID) into an offset control signal OS and a gain control signal GS, respectively. PID control units are of standard design and therefore need not be described in detail.

PID control unit 73 adjusts signal OS unit its input signal $\Delta$DC stays within a given tolerance range, and then issues on a second output a signal pulse RO (ready offset). PID control unit 75 adjusts signal GS until its input signal $\Delta$AC stays within a given range, and then issues on a second output a signal pulse RG (ready gain). As mentioned herein, this adjustment procedure is achieved during several repetitive scans of the e-beam across the sample wafer consisting of the "extreme" material samples. Bistable circuits 77 and 79 in range setting circuitry 47 can be both set by an initial pulse on control line 51 and can be individually reset by signal pulses RO and RG, respectively.

Control signals OS and GS furnished by PID control units 73 and 75, respectively, are converted to digital form by A/D converters 81 and 83, respectively. The digital signals are then transferred to O register 89 and G register 91, respectively, through a pair of AND gates 85 and 87 which are controlled by output signals from bistable circuits 77 and 79, respectively. The stored control values for offset and gain are converted from digital form to analog form by D/A converters 93 and 95, respectively. The analog signals are applied to offset control line 49A and gain control line 49B through selector switches 97 and 99, respectively.

Two manual setting units 101 and 103 are provided in the form of potentiometers or selector switches connected to voltage sources, for arbitrarily selecting a value for the offset control signal and the gain control signal, respectively. Thus, depending on the setting of selector switches 97 and 99, the range setting can be either achieved fully automatically, or a manual selection can be made.

The operation of range setting circuitry 47 is as follows. In an initial range setting procedure, the e-beam scans several times over the sample wafer comprising a substrate (silicon) and a strip of material of highest backscatter coefficient, e.g. a thick layer of gold or lead. An initial control pulse is issued on line 51 when the e-beam scan starts. Thus pulse sets both bistable circuits 77 and 79 so that AND gates 85 and 87 are opened to allow transfer of digital control signals OS and GS generated during the initial scan, into registers 89 and 91, respectively. Signals OS and GS are then updated during the range setting procedure (several scans of the sample wafer) until the DC component and the AC component of the BS indicator signal are approximately equal to the given reference values (ZERO and MAX, respectively).

Digital values in O register 89 and G register 91 follow the updating until PID control unit 73 or PID control unit 75 issues an RO (ready offset) or RG (ready gain) signal, respectively. The respective bistable circuit (77 or 79) is then reset, the associated AND gate (85 or 87) is inhibited, so that the value in O register 89 or G register 91 is "frozen", that is, no more updating. These frozen control values are then maintained, after the range setting (initial scan) procedure, during the entire e-beam exposure of the wafer. Only when a new wafer is placed into the system on a wafer holder comprising also a simple wafer, a new initial control pulse on line 51 sets bistable circuits 77 and 79, to again allow updating of the offset and gain control signal values in registers 89 and 91, respectively, during another initial scan (range setting procedure).

Figure 4A:
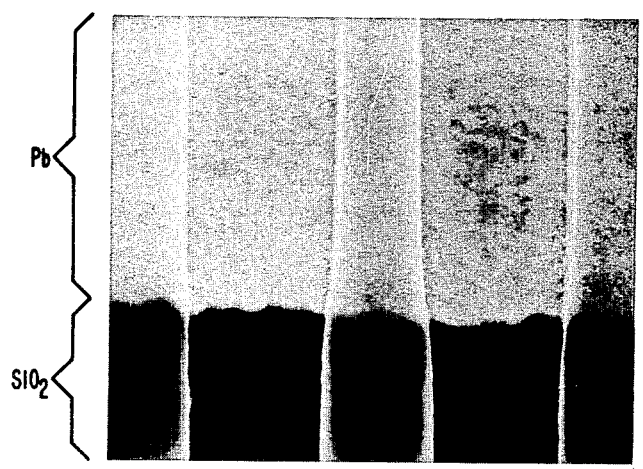
FIGS. 4A, 4B, and 4C are photographs of developed lines resulting from electron beam exposure in a photoresist over a nonuniform base layer under three conditions: (a) no compensation of proximity effect, (b) optimum compensation by invented method, (c) overcompensation by this invention, due to maladjustment.
Figure 4B:
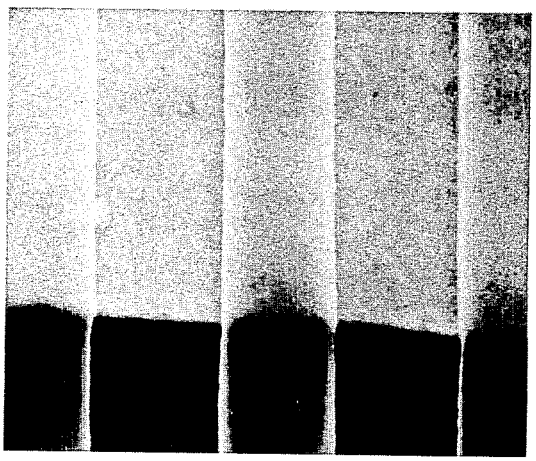
Figure 4C:
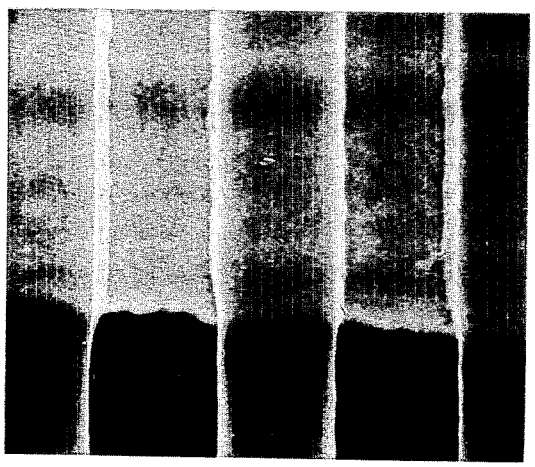

Actual results of the improved e-beam lithographic method of the present invention are shown in the photographs of FIGS. 4A, 4B, and 4C. Each photograph depicts a small wafer comprising a silicon oxide substrate (dark lower third) partially covered by a lead layer which is about 3500 Å thick (light upper two thirds). Photoresist was deposed on top of it. Two strips or lines (from top to bottom) were exposed by approximately 20 e-beam scan traces, developed and etched away so that three strips of the covering photoresist layer remain, and between them there are two channels with bare silicon or lead, respectively.

FIG. 4A shows a wafer produced with no correction during e-beam exposure, i.e. the stepping rate was kept constant at 1 MHz. As can be seen, above the lead there was some overexposure due to higher backscatter so that the etched channel is wider than desired (ca. 30%).

FIG. 4B shows a wafer for which a correction according to the invention was applied during exposure. The variation of the base stepping rate in response to the backscatter control signal was about 50%. The etched channels are of uniform width as desired.

FIG. 4C shows a wafer for which also a correction was applied during exposure, but the stepping rate variation was much higher, about 120% of the base stepping rate. Due to the high variation, an overcompensation occurred. The e-beam was stepped too fast over the lead, and the lower electron dose resulted in a narrower channel.

These results demonstrate that a good compensation of substrate or base-layer dependent proximity effects is possible with the present invention. The correct variation range can be found in experiments and will then be stored as limit values ZERO and MAX in the range setting circuitry. Hence, after each automatic calibration or range setting step, the optimum variation range of the stepping rate is applied.

Instead of a single backscatter detector, a plurality can be used, e.g. a pair of a quadruple of detectors. In many electron beam lithographic systems, pairs or quadruples of backscatter detectors will be available as a part of the system. The principles and operation of the invention will be the same with multiple detectors but the correction results will be improved because of the more exact measurement of the backscatter values. The different output signals of the backscatter detectors must, of course, be combined, e.g. by addition, before application of the VCO, or within the VCO. The range setting circuitry could be shared by all backscatter detectors through multiplexing circuitry.

The present invention can be easily combined with known methods of proximity correction, i.e. with techniques in which preprocessing of the pattern data is made. In the combined methods, shape-dependent proximity effects are corrected with the aid of an algorithm and by preprocessing, whereas priximity effects due to variations or irregularities in the substrate or base layer material are corrected in real time by the present invention.

We claim:

1. A method of improving the uniformness of patterns generated by electron beam lithography in a covering layer over a substrate or base layer, comprising the steps of; generating an indication signal of the quantity of backscattered electrons obtained during electron beam exposure; applying a control signal as a function of said indication signal for adjusting the electron beam stepping rate such that the exposure dose per unit length is kept substantially constant despite variations in the material or topography of the substrate or base layer, and obtaining prior to an exposure process, an offset value and a gain value of at least one backscatter detector to obtain the indication signal; said offset and gain values selected by the steps of prescanning a sample comprising two materials having the largest expected difference in backscatter characteristics, and individually adjusting during said prescanning the offset value and the gain value until the indication signal used for controlling the stepping rate remains within given limits.

2. The method in accordance with claim 1, wherein the indication signal is used as an auxiliary control signal for a voltage controlled oscillator, said voltage controlled oscillator producing an output that determines the electron beam stepping rate, and varying the stepping rate proportional to the variations in the auxiliary control signal.

3. A method in accordance with claim 1, wherein the gain value is used to adjust the gain of a photomultiplier tube, and the offset value is used to adjust the zero offset value of an electronic output amplifier in each backscatter detector used to obtain the indication signal.

4. Apparatus for improving the uniformness of patterns generated in an electron beam lithography system, comprising; means for furnishing an indicator signal representative of the amount of backscattered electrons to electron beam control circuit in said lithography system, and comprising at least one backscatter detector having amplifying means, range setting circuitry for preselecting an offset value and a gain value for said amplifying means during a prescan of a sample, said sample having two different materials with extremely different backscatter characteristics; and means in said electron beam control circuitry for varying a beam stepping rate control signal in response to said indicator signal.

5. The apparatus in accordance with claim 4, wherein said range setting circuitry comprises:
- a DC/AC separator for separately furnishing a DC component and an AC component of said indicator signal,
- comparing means for comparing the DC component to a zero reference value and the AC component to a maximum reference value, and for furnishing a DC error signal and an AC error signal, and
- proportional integral control means connected to said comparing means for generating during a prescan procedure an offset value and a gain value to maintain the DC error signal and the AC error signal within a given tolerance range.

6. The apparatus in accordance with claim 5, further comprising storage means provided for storing the offset value and the gain value, and gating means provided for gating said offset value and said gain value from said proportional integral control means into said storage means only during an initial prescan period and for inhibiting said gating means when output control signals from said proportional integral control means inidcate that the DC error signal or AC error signal, respectively, are within said given tolerance range.

7. The apparatus of claim 6, further comprising converter means responsive to signals stored in said storage means, manual setting means for adjusting converted signals of said offset value and said gain value to manually determine a given tolerance range.

* * * * *